United States Patent
Jain et al.

(10) Patent No.: US 10,644,654 B2
(45) Date of Patent: May 5, 2020

(54) HYBRID CASCODE CONSTRUCTIONS WITH MULTIPLE TRANSISTOR TYPES

(71) Applicant: GLOBALFOUNDRIES Inc., Grand Cayman (KY)

(72) Inventors: Vibhor Jain, Essex Junction, VT (US); Anthony K. Stamper, Williston, VT (US); Alvin J. Joseph, Williston, VT (US); John J. Pekarik, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/701,672

(22) Filed: Sep. 12, 2017

(65) Prior Publication Data

US 2019/0081597 A1 Mar. 14, 2019

(51) Int. Cl.
*H01L 27/07* (2006.01)
*H03F 1/22* (2006.01)
(Continued)

(52) U.S. Cl.
CPC ........... *H03F 1/22* (2013.01); *H01L 27/0623* (2013.01); *H01L 27/0705* (2013.01);
(Continued)

(58) Field of Classification Search
CPC ......... H01L 2924/13051; H01L 29/737; H01L 29/66242; H01L 29/66318; H01L 29/66484; H01L 29/4238; H01L 29/1095; H01L 29/06; H01L 29/069; H01L 29/0692; H01L 29/78; H01L 21/28114; H01L 27/02; H01L 27/02; H01L 27/0207; H01L 27/06; H01L 27/062; H01L 27/0623;
(Continued)

(56) References Cited

U.S. PATENT DOCUMENTS 5,057,894 A * 10/1991 Ikeda ................ H01L 21/28525
257/370
5,247,200 A * 9/1993 Momose ............. G11C 13/003
257/370

(Continued)

OTHER PUBLICATIONS

Voinigescu et al., "SiGe BiCMOS for Analog, High-Speed Digital and Millimetre-Wave Applications Beyond 50 GHz", Bipolar/BiCMOS Circuits and Technology Meeting, 2006.

*Primary Examiner* — Monica D Harrison
*Assistant Examiner* — John Lin
(74) *Attorney, Agent, or Firm* — Thompson Hine LLP; Anthony Canale (57) ABSTRACT

Structures for a cascode integrated circuit and methods of forming such structures. A field-effect transistor of the structure includes a gate electrode finger, a first source/drain region, and a second source/drain region. A bipolar junction transistor of the structure includes a first terminal, a base layer with an intrinsic base portion arranged on the first terminal, and a second terminal that includes one or more fingers arranged on the intrinsic base portion of the base layer. The intrinsic base portion of the base layer is arranged in a vertical direction between the first terminal and the second terminal. The first source/drain region is coupled with the first terminal, and the first source/drain region at least partially surrounds the bipolar junction transistor.

15 Claims, 6 Drawing Sheets

(51) Int. Cl.
H01L 27/06 (2006.01)
H01L 29/06 (2006.01)
H01L 29/78 (2006.01)
H01L 27/12 (2006.01)
H01L 29/08 (2006.01)
H01L 29/737 (2006.01)
H01L 29/732 (2006.01)
H03F 3/195 (2006.01)
H01L 29/423 (2006.01)
H01L 29/73 (2006.01)
H01L 27/02 (2006.01)

(52) U.S. Cl.
CPC ...... *H01L 27/1203* (2013.01); *H01L 29/0649* (2013.01); *H01L 29/0692* (2013.01); *H01L 29/0821* (2013.01); *H01L 29/4238* (2013.01); *H01L 29/732* (2013.01); *H01L 29/7302* (2013.01); *H01L 29/7327* (2013.01); *H01L 29/7371* (2013.01); *H01L 29/78* (2013.01); *H03F 1/223* (2013.01); *H03F 3/195* (2013.01); *H01L 27/0207* (2013.01); *H01L 27/0716* (2013.01); *H01L 29/0813* (2013.01); *H03F 2200/294* (2013.01)

(58) Field of Classification Search
CPC ..... H01L 27/07; H01L 27/07; H01L 27/0705; H01L 27/0711; H01L 27/0716; H01L 27/12; H01L 27/12; H01L 27/1203; H01L 29/73; H01L 29/7371; H01L 29/66234; H01L 29/66477
USPC ....................................................... 257/401
See application file for complete search history.

(56) References Cited

U.S. PATENT DOCUMENTS

| | | |
|---|---|---|
| 6,140,687 A | 10/2000 | Shimomura et al. |
| 6,744,322 B1 | 6/2004 | Ma et al. |
| 7,569,887 B2 | 8/2009 | Otsuki |
| 9,331,097 B2 | 5/2016 | Cai et al. |
| 2013/0043483 A1* | 2/2013 | Chan ................. H01L 29/66242 257/76 |

* cited by examiner

HYBRID CASCODE CONSTRUCTIONS WITH MULTIPLE TRANSISTOR TYPES

BACKGROUND

The invention relates generally to semiconductor device and integrated circuit fabrication and, in particular, to structures for a cascode integrated circuit, structures for a field-effect transistor, and methods of forming such structures.

Radio-frequency integrated circuits (RFICs) are found in many type of devices, such as mobile phones. An RFIC generally requires a switch to select and control connections between an antenna, a transmitter circuit (e.g., a power amplifier), and a receiver circuit (e.g., a low noise amplifier or LNA). A main purpose of an LNA is to provide gain that boosts the power of received signals while preserving the input signal-to-noise ratio at output, which is an important characteristic because the received signals are usually weak and can be commingled with a large amount of noise.

Most conventional LNAs are constructed either with a single transistor configuration like a common emitter or common source or with a cascode design. A cascode circuit is often constructed from two transistors, either a pair of bipolar junction transistors or a pair of field effect transistors, with one of the transistors operating as a common emitter or common source and the other of the transistors operating as a common base or common gate. A cascode circuit constructed from only field-effect transistors may cause the associated LNA to suffer from low input intercept point (IIP3) and low gain issues on the input power axis. A cascode circuit constructed from only bipolar junction transistors may cause the associated LNA to be incapable of operating at a low voltage due to an insufficient voltage across the collector-emitter junction (Vce).

Improved structures for a cascode integrated circuit, structures for a field-effect transistor, and methods of forming such structures are needed that overcome these and other deficiencies of conventional cascode integrated circuits.

SUMMARY

In an embodiment of the invention, a structure includes a field-effect transistor with a gate electrode finger, a first source/drain region, and a second source/drain region. The structure further includes a bipolar junction transistor with a first terminal, a base layer with an intrinsic base portion arranged on the first terminal, and a second terminal that includes one or more fingers arranged on the intrinsic base portion of the base layer. The intrinsic base portion of the base layer is arranged in a vertical direction between the first terminal and the second terminal. The first source/drain region is coupled with the first terminal, and the first source/drain region at least partially surrounds the bipolar junction transistor.

In an embodiment of the invention, a structure is provided that is formed using a device layer of a silicon-on-insulator substrate. The structure includes a field-effect transistor with a first source/drain region in the device layer, a second source/drain region in the device layer, a body in the device layer, and a gate electrode finger with a plurality of segments arranged to surround the first source/drain region. The plurality of segments include a first segment and a second segment arranged to cross the first segment to define an exterior corner region of the body. A body contact is arranged in the exterior corner region of the body, and is coupled with the body.

In an embodiment of the invention, a method includes forming a gate electrode finger, a first source/drain region, and a second source/drain region of a field-effect transistor. The method further includes forming a bipolar junction transistor that includes a first terminal, a base layer with an intrinsic base portion arranged on the first terminal, and a second terminal that includes one or more fingers arranged on the intrinsic base portion of the base layer. The intrinsic base portion of the base layer is arranged in a vertical direction between the first terminal and the second terminal. The first source/drain region is coupled with the first terminal, and the first source/drain region at least partially surrounds the bipolar junction transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
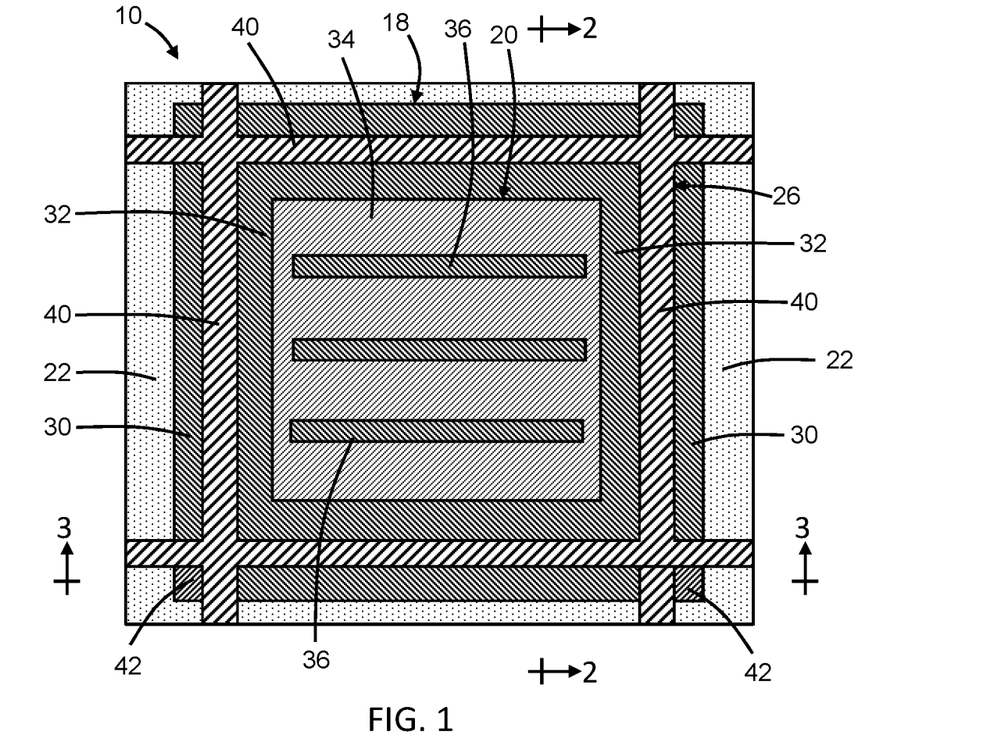
FIG. 1 is a top view of a device structure in accordance with embodiments of the invention.
Figure 2:
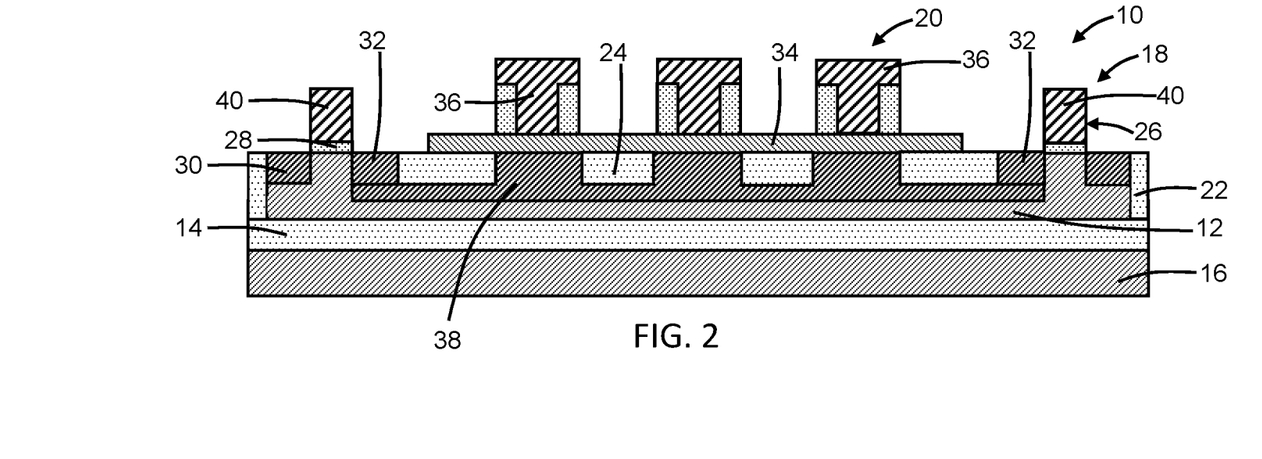
FIG. 2 is a cross-sectional view taken generally along line 2-2 in FIG. 1.
Figure 3:
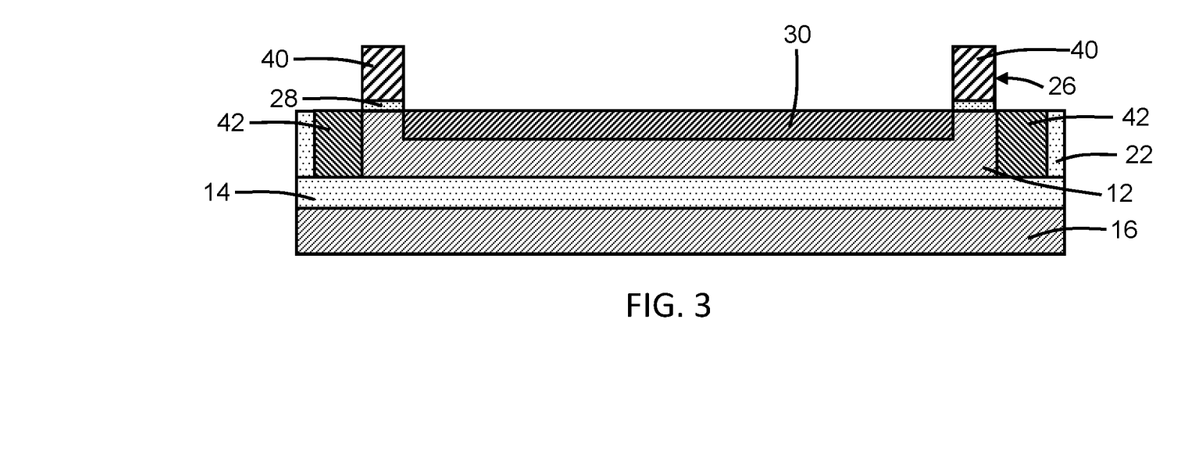
FIG. 3 is a cross-sectional view taken generally along line 3-3 in FIG. 1.

With reference to FIGS. 1-3 in which like reference numerals refer to like features and in accordance with embodiments of the invention, a device structure 10 may be formed using a semiconductor-on-insulator (SOI) substrate that includes a device layer 12, a buried oxide (BOX) layer 14, and a handle wafer 16. The device layer 12 is separated from the handle wafer 16 by the intervening BOX layer 14 and is considerably thinner than the handle wafer 16. The device layer 12 is located on a top surface of the BOX layer 14 and is electrically insulated from the handle wafer 16 by the BOX layer 14. The BOX layer 14 may be composed of an electrical insulator, such as silicon dioxide ($SiO_2$).

The device structure 10 includes a field-effect transistor 18 and a bipolar junction transistor 20 that is located interior of the field-effect transistor 18. In an embodiment, the field-effect transistor 18 is an n-type field-effect transistor (NFET) and the bipolar junction transistor 20 is an NPN-type bipolar junction transistor (NPN). In another embodiment, the field-effect transistor 18 is a p-type field-effect transistor (PFET) and the bipolar junction transistor 20 is a PNP-type bipolar junction transistor (PNP). The device structure 10 is surrounded by shallow trench isolation regions 22, which supply electrical isolation for the device structure 10. The shallow trench isolation regions may be formed by etching trenches in the device layer 12 that extend in depth to the BOX layer 14, depositing a dielectric material to fill the trenches, and planarizing the dielectric material using, for example, chemical mechanical polishing (CMP). Additional shallow trench isolation regions 24 may be formed interior of the shallow trench isolation regions 22. The dielectric material comprising the shallow trench isolation regions 22, 24 may be silicon dioxide ($SiO_2$), or another electrical insulator, deposited by CVD.

The field-effect transistor 18 includes a gate electrode finger 26, a gate dielectric 28 positioned between the gate electrode finger 26 and the device layer 12, a heavily-doped source/drain region 30 in the device layer 12 arranged between the gate electrode finger 26 and the shallow trench isolation regions 22, and a heavily-doped source/drain region 32 in the device layer 12 interior of the gate electrode finger 26. The source/drain region 30 is located on an opposite side of the gate electrode finger 26 from the source/drain region 32, and the source/drain region 30 and the source/drain region 32 are separated by a channel region also located in the device layer 12. The term "source/drain region" as used herein refers to a doped region of semiconductor material that can function as either a source or a drain of a field-effect transistor. In an embodiment, the source/drain region 30 may be a source region, and the source/drain region 32 may be a drain region.

The channel is generally located beneath the gate electrode finger 26 and supports carrier flow between the source/drain region 30 and the source/drain region 32 when a control voltage is supplied to the gate electrode finger 26. The semiconductor material constituting the channel may have a conductivity type (i.e., polarity) that is opposite to the conductivity type of the semiconductor material contained in the source/drain region 30 and the source/drain region 32. A section of the device layer 12 located between the source/drain regions 30, 32 and the BOX layer 14 provides a body of the field-effect transistor 18.

The field-effect transistor 18 may be fabricated by complementary metal oxide semiconductor (CMOS) processes during front-end-of-line (FEOL) processing. The gate electrode finger 26 and gate dielectric 28 may be formed by depositing a layer stack and patterning the deposited layer stack with photolithography and etching. The gate electrode finger 26 may be composed of a conductor, such as a metal, doped polycrystalline silicon (polysilicon), or a layered stack of these and other conductive materials. The source/drain region 30 and the source/drain region 32 may be formed in a self-aligned manner by implantation or diffusion of a suitable dopant, such as a Group V dopant like arsenic (As) or phosphorous (P) for n-type conductivity or a Group III dopant like boron (B) for p-type conductivity, into the semiconductor material of the device layer 12. The gate dielectric 28 may be composed of an electrical insulator including, but not limited to, silicon dioxide ($SiO_2$), a high-k dielectric material such as hafnium oxide ($HfO_2$), or layered stacks of these and other dielectric materials. The field-effect transistor 18 may include other elements, such as halo regions and lightly doped drain (LDD) extensions in the device layer 12, and non-conductive spacers (not shown) formed adjacent to the vertical sidewalls of the gate electrode finger 26. The implants doping the source/drain region 30 and the source/drain region 32 of the field-effect transistor 18 and the device geometry of the field-effect transistor 18 may be selected to adjust for a relatively high threshold frequency. The channel length and width of the field-effect transistor 18 may be set for optimizing the electrical performance, such as current density or gain.

The bipolar junction transistor 20 includes a base layer 34 located on a top surface of the device layer 12. The base layer 34 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 34 may be uniform or graded and/or stepped across its thickness. In an alternative embodiment, the base layer 34 may be composed of silicon and not contain germanium. The semiconductor material of the base layer 34 may comprise a dopant, such as a p-type dopant selected from Group III of the Periodic Table (e.g., boron) in a concentration that is effective to impart p-type conductivity and, optionally, carbon (C) to suppress the out-diffusion of the p-type dopant. The base layer 34 may be formed from a semiconductor material layer deposited using a low temperature epitaxial (LTE) growth process, such as vapor phase epitaxy (VPE).

The bipolar junction transistor 20 includes one or more collector fingers 36 that are located on a top surface of the base layer 34. In the representative embodiment, the bipolar junction transistor 20 includes multiple collector fingers 36 that are arranged with a parallel arrangement. This particular representative embodiment represents a "collector-up" bipolar junction transistor 20. The collector fingers 36 may be comprised of a different semiconductor material than the base layer 34 and may have an opposite conductivity type from the base layer 34. For example, the collector fingers 36 may lack germanium that is present in at least a portion of the base layer 34. In a representative embodiment, the collector fingers 36 may be composed of a semiconductor material, such as silicon, deposited by chemical vapor deposition (CVD) and may be heavily doped with a concentration of an n-type dopant selected from Group V of the Periodic Table (e.g., phosphorus (P) or arsenic (As)) in a concentration that is effective to impart n-type conductivity.

The bipolar junction transistor 20 includes an emitter 38 represented by a section of the device layer 12 that contains a concentration of an n-type dopant selected from Group V of the Periodic Table (e.g., phosphorus (P) or arsenic (As)) in a concentration that is effective to impart n-type conductivity. The base layer 34 may be composed of a different semiconductor material than the emitter 38 and may have an opposite conductivity type from the emitter 38. The implants doping the terminals of the bipolar junction transistor 20 and the device geometry of the bipolar junction transistor 20 may be selected to adjust for a relatively high gain.

In general, the field-effect transistor 18 and the bipolar junction transistor 20 are each characterized by a minimum noise factor and a maximum gain, which may be exhibited at different bias conditions (i.e., different current densities). In order to optimize the optimum current density for the field-effect transistor 18 and for the bipolar junction transistor 20 such that the total current is same between the two devices that are coupled in series, the length of the bipolar junction transistor 20 and/or the width of the field-effect transistor 18 may be adjusted.

The bipolar junction transistor 20 is characterized by a collector-up vertical architecture that includes the collector fingers 36 as a terminal, the emitter 38 as another terminal, and an intrinsic base defined by the sections of the base layer 34 that are positioned between the emitter 38 and the collector fingers 36. The intrinsic base is coextensive with the emitter 38 along a p-n junction, and the collector fingers 36 are coextensive with the intrinsic base along another p-n junction. Sections of the base layer 34 that are arranged peripheral to the intrinsic base may collectively define an extrinsic base that is coupled with the intrinsic base and that is exposed to provide a surface area to which contact can be established by a vertically-extending contact with the base layer 34. The bipolar junction transistor 20 may be characterized as a heterojunction bipolar transistor (HBT) if two or all three of the collector fingers 36, the emitter 38, and the base layer 34 are comprised of semiconductor materials with different bandgaps. In particular, the bipolar junction transistor 20 can be formed from a homo-junction or hetero-junction semiconductor, such as silicon for the former and silicon germanium for the latter.

The emitter 38 of the bipolar junction transistor 20 and the source/drain region 32 of the field-effect transistor 18, which are composed semiconductor material with the same conductivity type, abut and are connected with each other. The emitter 38 extends beneath the shallow trench isolation region 24 that is adjacent to the source/drain region 32 and merges with the source/drain region 32 so that the emitter 38 and the source/drain region 32 are electrically and physically connected, as well as directly coupled. In an embodiment, the source/drain region 32 may be the drain of the field-effect transistor 18 and the emitter 38 is directly coupled in electrical continuity with the drain of the field-effect transistor 18.

The gate electrode finger 26 of the field-effect transistor 18 may include a plurality of interconnected segments 40 that surround the bipolar junction transistor 20 on all sides. In the representative embodiment, the segments 40 have a rectangular arrangement in which the segments 40 intersect at right angles near their opposite ends. Alternatively, the gate electrode finger 26 may have a different shape. The segments 40 are inset from the shallow trench isolation regions 22 to provide space for the source/drain region 30 and extend onto the shallow trench isolation regions 22.

As best shown in FIGS. 1 and 3, one or more body contacts 42 may be formed in areas of the device layer 12 in the exterior corner regions defined by the crossed segments 40 of the gate electrode finger 26 and the shallow trench isolation regions 22. The body contacts 42 may be formed by ion implantation, and may have the same conductivity type as the body defined by the device layer 12. The semiconductor material of the body contacts 42 may comprise a dopant, such as a p-type dopant selected from Group III of the Periodic Table (e.g., boron), in a concentration that is effective to impart p-type conductivity. Merged sections of the source/drain region 32 and emitter 38 are located in the interior corners of the body of the device layer 12 on the opposite side of the crossed segments 40.

The source/drain region 30 and source/drain region 32 also each surround the bipolar junction transistor 20 on all sides. In the representative embodiment, the base layer 34 has a rectangular shape with multiple sides that are inset inside, or interior of, the gate electrode finger 26, the source/drain region 30, and the source/drain region 32. The collector fingers 36 are aligned parallel with an opposite pair of the side edges of the base layer 34, and are also aligned parallel with segments 40 of an opposite pair of the gate electrode finger 26 adjacent to this opposite pair of the side edges of the base layer 34.

Silicidation, middle-of-line (MOL), and back-end-of-line (BEOL) processing follows, which includes formation of contacts by MOL processing and formation of wires and vias by BEOL processing for an interconnect structure coupled with the device structure 10.

In an alternative embodiment, the bipolar junction transistor 20 may be recast as a emitter-up vertical architecture in which the collector fingers 36 are repurposed as a set of emitter fingers and the emitter 38 is repurposed as a collector. In conjunction with this modification to the bipolar junction transistor 20, the source/drain region 32 of the field-effect transistor 18 may be the source and the emitter 38 is coupled in electrical continuity with the source of the field-effect transistor 18.

In an alternative embodiment, the device structure 10 may be stacked with additional device structures 10 that are wired together to participate in forming a large-area amplifier circuit.

Figure 4:
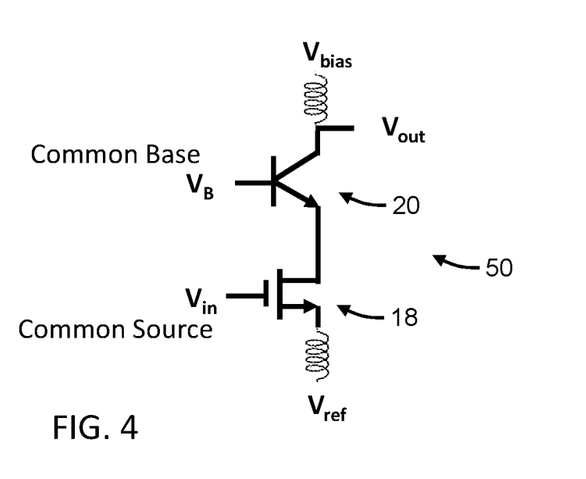
FIG. 4 is a simplified schematic view of a cascode low noise amplifier formed using the device structure of FIGS. 1-3.

With reference to FIG. 4 in which like reference numerals refer to like features in FIGS. 1-3, a cascode low noise amplifier (LNA) circuit 50 includes the field-effect transistor 18 of device structure 10 as a common base NPN field-effect transistor and the bipolar junction transistor 20 of device structure 10 as a common source n-type field-effect transistor. The source/drain region 32 of the field-effect transistor 18 may be the drain such that the emitter 38 of the bipolar junction transistor 20 is coupled in electrical continuity with the drain of the field-effect transistor 18. The field-effect transistor 18 operates as a common source in an input stage of the cascode LNA circuit 50, and the bipolar junction transistor 20 operates as a common base in an output stage of the cascode LNA circuit 50. The cascode LNA circuit 50 further includes bias circuits (not shown) 74 coupled with the field-effect transistor 18 and bipolar junction transistor 20, and may also include various coupling capacitors and inductors. An input signal Vin is directed into the cascode LNA circuit 50 at the gate electrode finger 26 of the field-effect transistor 18 and is output from the cascode LNA circuit 50 at the collector fingers 36 of the bipolar junction transistor 20 as an output signal Vout.

Figure 5:
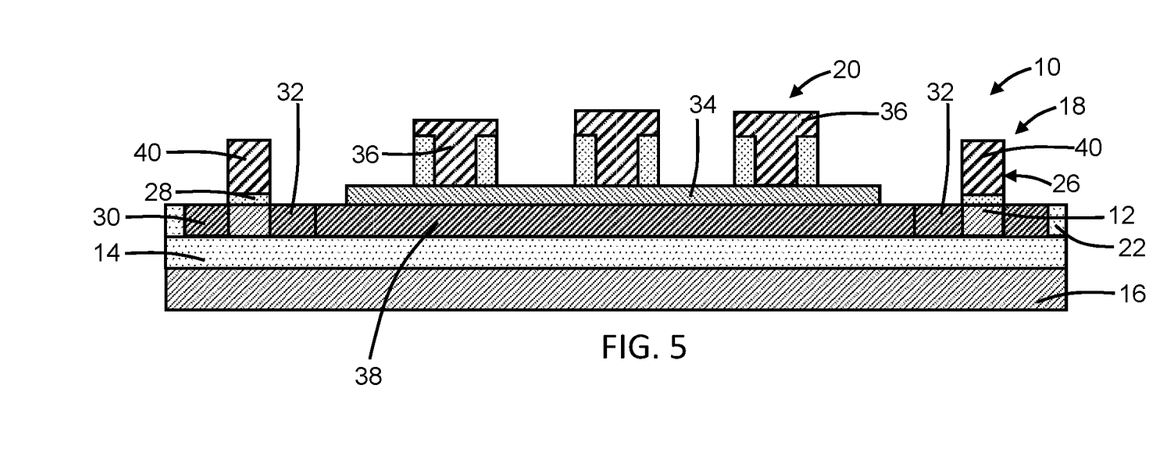
FIG. 5 is a cross-sectional view similar to FIG. 2 of a device structure in accordance with embodiments of the invention.
Figure 6:
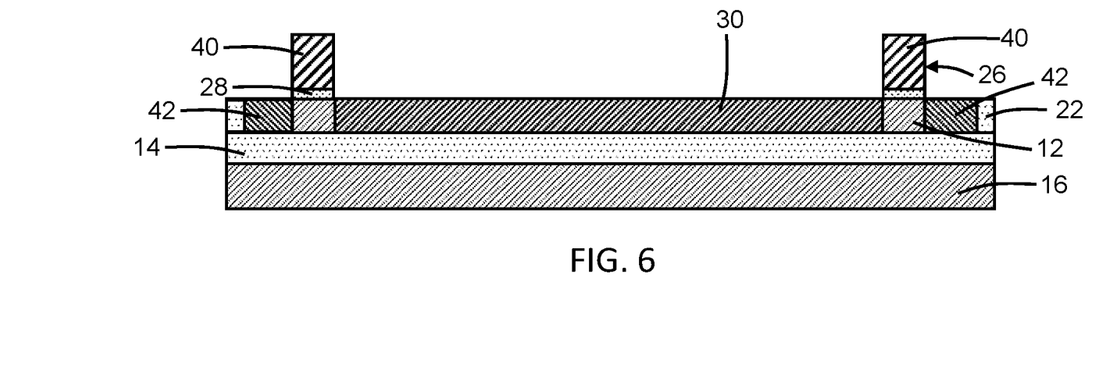
FIG. 6 is a cross-sectional view similar to FIG. 3 of the device structure of FIG. 5.

With reference to FIGS. 5, 6 in which like reference numerals refer to like features respectively in FIGS. 2, 3 and in accordance with alternative embodiments, the device layer 12 may be thinned such that the source/drain region 30 and the source/drain region 32 of the field-effect transistor 18 extend in depth to touch the BOX layer 14. In an embodiment, the device layer 12 may belong to an extremely thin semiconductor-on-insulator (ETSOI) substrate or a Fully-Depleted semiconductor-on-insulator substrate (FDSOI).

Figure 7:
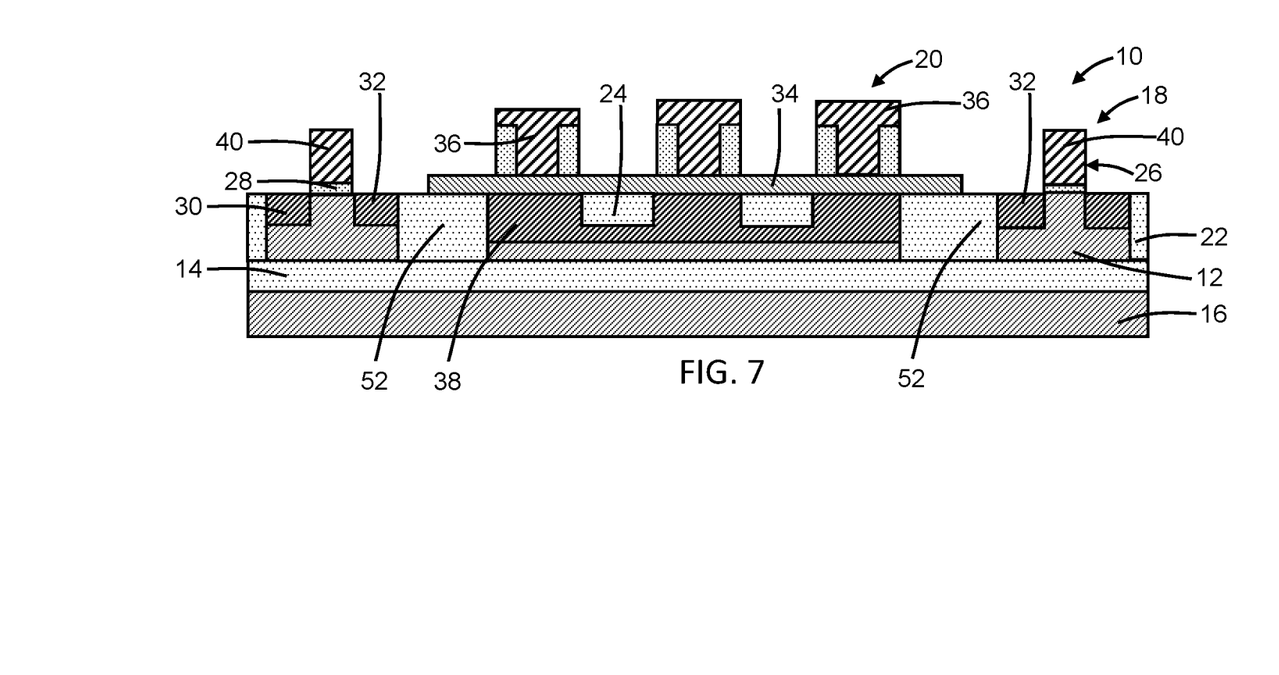
FIG. 7 is a cross-sectional view of a device structure in accordance with embodiments of the invention.
Figure 8:
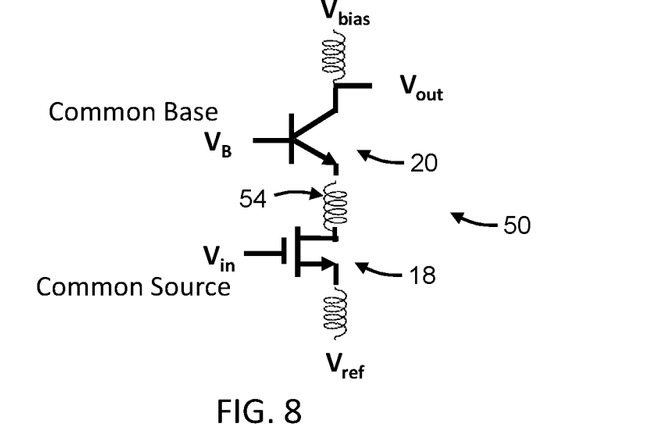
FIG. 8 is a simplified schematic view of a cascode low noise amplifier formed using the device structure of FIG. 7.

With reference to FIGS. 7, 8 in which like reference numerals refer to like features in FIGS. 2, 4 and in accordance with alternative embodiments, a trench isolation region 52 may be provided that electrically isolates the source/drain region 30 of the field-effect transistor 18 from the emitter 38 of the bipolar junction transistor 20. To that end, a trench isolation region 52 may be formed that penetrates through the device layer 12 into the BOX layer 14. The trench isolation region 52 may be formed by etching a trench through the device layer 12 and into the BOX layer 14, and filling the trench with a dielectric material, such as silicon dioxide ($SiO_2$). A connection may be provided by conductive features in the interconnect structure to couple the source/drain region 30 of the field-effect transistor 18 with the emitter 38 of the bipolar junction transistor 20, which permits additional passive elements 54, such as an inductor or resistor, to be connected in the cascode LNA circuit 50 between the source/drain region 30 of the field-effect transistor 18 and the emitter 38 of the bipolar junction transistor 20.

Figure 9:
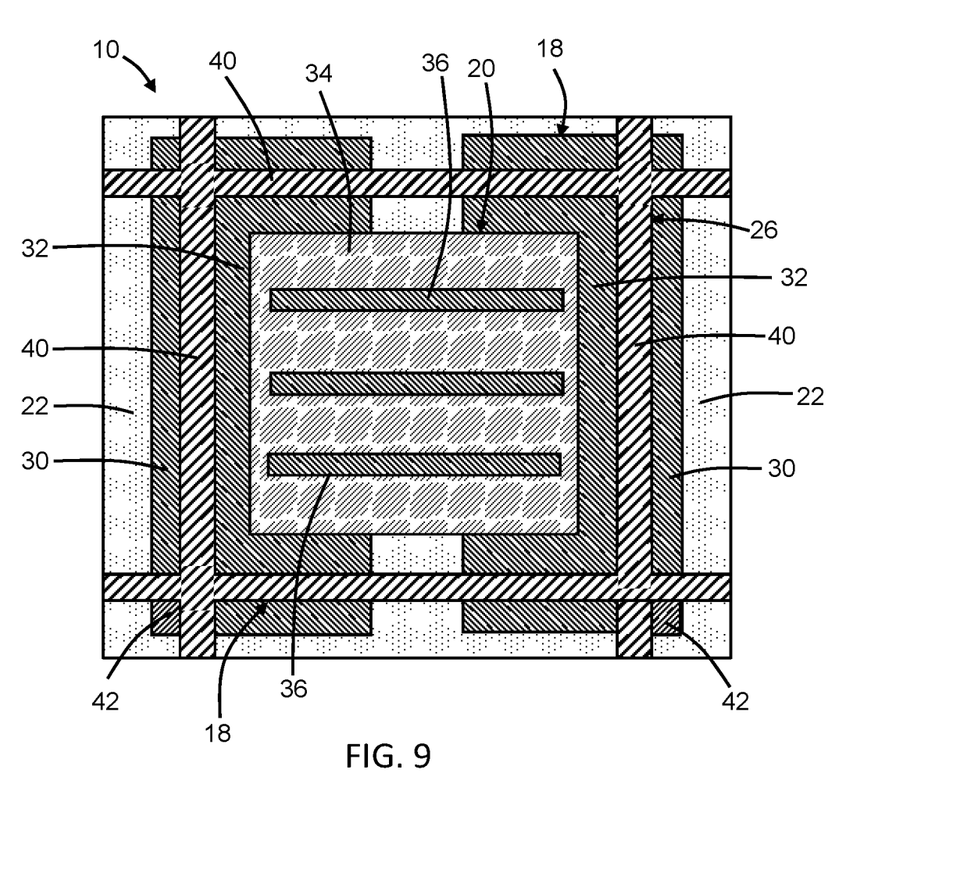
FIG. 9 is a top view of a device structure in accordance with embodiments of the invention.

With reference to FIG. 9 in which like reference numerals refer to like features in FIG. 1 and in accordance with alternative embodiments, the source/drain regions 30, 32 of the field-effect transistor 18 may be modified to provide discontinuities or gaps that are filled by the shallow trench isolation regions 24. The emitter 38 of the bipolar junction transistor 20 abuts and is connected with both sections of the source/drain region 32. In the representative embodiment, the segments 40 of the gate electrode finger 26 remain interconnected. In an alternative embodiment, the segments 40 of the gate electrode finger 26 may have the same discontinuity as the source/drain regions 30, 32. The gate width can be adjusted, while the segments 40 remain interconnected, relative to a given emitter length. All or part of the segments 40 that cross the discontinuities may be widened to promote contact formation.

Figure 10:
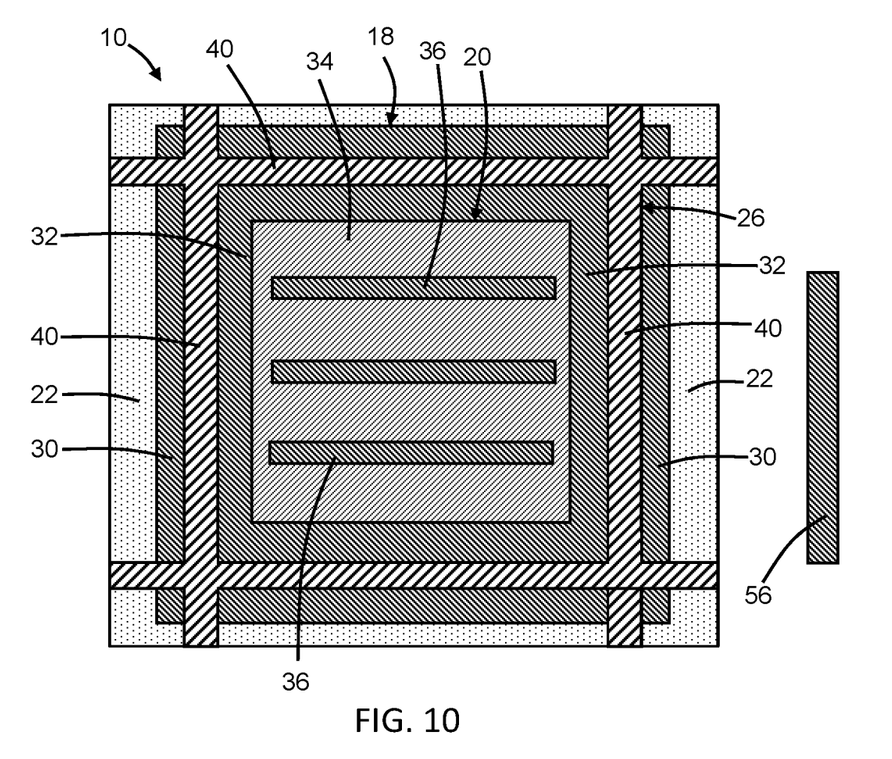
FIG. 10 is a top view of a device structure in accordance with embodiments of the invention.

With reference to FIG. 10 in which like reference numerals refer to like features in FIG. 1 and in accordance with alternative embodiments, the device structure 10 may be formed using a bulk substrate, rather than an SOI substrate. In this instance, a body contact 56 may be provided that is coupled with the body of the field-effect transistor 18.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a field-effect transistor including a gate electrode finger, a first source/drain region, and a second source/drain region; and
    a bipolar junction transistor including a first terminal, a base layer with an intrinsic base portion on the first terminal, and a second terminal that includes one or more fingers on the intrinsic base portion of the base layer, the intrinsic base portion of the base layer arranged in a vertical direction between the first terminal and the second terminal,
    wherein the first source/drain region is coupled with the first terminal, the first source/drain region at least partially surrounds the bipolar junction transistor, the field-effect transistor is arranged in an input stage of a cascode amplifier circuit, and the bipolar junction transistor is arranged in an output stage of the cascode amplifier circuit.

2. The structure of claim 1 wherein the first source/drain region is a drain region of the field-effect transistor, the first terminal is an emitter of the bipolar junction transistor, and the drain region and the emitter are formed in a device layer of a silicon-on-insulator substrate.

3. The structure of claim 2 further comprising:
    a dielectric isolation region extending vertically in the device layer to a buried oxide layer of the silicon-on-insulator substrate, the dielectric isolation region arranged between the drain region and the emitter.

4. The structure of claim 1 wherein the bipolar junction transistor is a heterojunction bipolar transistor.

5. The structure of claim 1 wherein the first source/drain region is directly coupled with the first terminal.

6. The structure of claim 1 further comprising:
    a dielectric isolation region arranged between the first source/drain region and the first terminal.

7. The structure of claim 6 further comprising:
    a passive device element coupled with the first source/drain region and with the first terminal.

8. The structure of claim 1 wherein the first source/drain region is a source region of the field-effect transistor, the first terminal is a collector of the bipolar junction transistor, and the source region and the collector are formed in a device layer of a silicon-on-insulator substrate.

9. The structure of claim 1 wherein the first source/drain region and the second source/drain region each extend vertically in a device layer of a silicon-on-insulator substrate to intersect with a buried oxide layer of the silicon-on-insulator substrate.

10. The structure of claim 1 wherein the first source/drain region and the first terminal are formed in a device layer of a silicon-on-insulator substrate.

11. The structure of claim 1 wherein the bipolar junction transistor and the field-effect transistor are formed in a bulk substrate.

12. The structure of claim 1 wherein the first source/drain region completely surrounds the bipolar junction transistor.

13. The structure of claim 1 wherein the gate electrode finger and the second source/drain region completely surround the bipolar junction transistor, and the first source/drain region is arranged between the gate electrode finger and the bipolar junction transistor.

14. The structure of claim 1 wherein the first source/drain region partially surrounds the bipolar junction transistor with one or more discontinuities breaking the first source/drain region into a first section and a second section, and further comprising:
one or more trench isolation regions located in the one or more discontinuities.

15. A method comprising:
forming a field-effect transistor that includes a gate electrode finger, a first source/drain region, and a second source/drain region; and
forming a bipolar junction transistor that includes a first terminal, a base layer with an intrinsic base portion arranged on the first terminal, and a second terminal that includes one or more fingers arranged on the intrinsic base portion of the base layer,
wherein the intrinsic base portion of the base layer is arranged in a vertical direction between the first terminal and the second terminal, the first source/drain region is coupled with the first terminal, the first source/drain region at least partially surrounds the bipolar junction transistor, the field-effect transistor is arranged in an input stage of a cascode amplifier circuit, and the bipolar junction transistor is arranged in an output stage of the cascode amplifier circuit.

* * * * *